US 8,293,610 B2

(12) United States Patent
Beyer et al.

(10) Patent No.: US 8,293,610 B2
(45) Date of Patent: Oct. 23, 2012

(54) SEMICONDUCTOR DEVICE COMPRISING A METAL GATE STACK OF REDUCED HEIGHT AND METHOD OF FORMING THE SAME

(75) Inventors: Sven Beyer, Dresden (DE); Rolf Stephan, Dresden (DE); Martin Trentzsch, Dresden (DE); Patrick Press, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 744 days.

(21) Appl. No.: 12/204,395

(22) Filed: Sep. 4, 2008

(65) Prior Publication Data
US 2009/0218639 A1 Sep. 3, 2009

(30) Foreign Application Priority Data

Feb. 29, 2008 (DE) .......................... 10 2008 011 813

(51) Int. Cl.
*H01L 29/78* (2006.01)
(52) U.S. Cl. ........ 438/287; 438/275; 438/151; 257/410; 257/E21.409
(58) Field of Classification Search .................. 438/287, 438/275, 151; 257/410, E21.409, E29.255
See application file for complete search history.

(56) References Cited

U.S. PATENT DOCUMENTS

| | | | | |
|---|---|---|---|---|
| 5,998,290 A * | 12/1999 | Wu et al. | ........................ | 438/595 |
| 6,709,935 B1 * | 3/2004 | Yu | ................................. | 438/289 |
| 6,759,695 B2 * | 7/2004 | Ma et al. | ........................ | 257/192 |
| 7,091,563 B2 * | 8/2006 | Chidambarrao et al. | ..... | 257/369 |
| 7,112,495 B2 * | 9/2006 | Ko et al. | ........................ | 438/300 |
| 7,144,767 B2 * | 12/2006 | Chidambarrao et al. | ..... | 438/236 |
| 7,229,893 B2 * | 6/2007 | Wang et al. | .................... | 438/424 |
| 2003/0146458 A1 | 8/2003 | Horiuchi et al. | ............... | 257/288 |
| 2005/0145894 A1 | 7/2005 | Chau et al. | .................... | 257/288 |
| 2006/0148181 A1 * | 7/2006 | Chan et al. | .................... | 438/289 |
| 2007/0132038 A1 * | 6/2007 | Chong et al. | .................. | 257/401 |
| 2008/0050863 A1 * | 2/2008 | Henson et al. | ................ | 438/151 |
| 2008/0102634 A1 | 5/2008 | Pas et al. | ....................... | 438/692 |

FOREIGN PATENT DOCUMENTS

| | | |
|---|---|---|
| DE | 102007041207 A1 | 3/2009 |
| JP | 2-162738 | 6/1990 |
| JP | 2008-125175 | 5/2008 |

OTHER PUBLICATIONS

Translation of Official Communication from German Patent Office for German Patent Application No. 10 2008 011 813.3 dated Apr. 24, 2009.
Dai and Liu, Rough Polysilicon Film as a High-Performance Antireflective Layer for Sub-Half-Micron Photolithography, *Jpn. J. Appl. Phys.*, 34:6611-14, 1995.
Horstmann et al., "Integration and Optimization of Embedded-SiGe, Compressive and Tensile Stressed Liner Films, and Stress Memorization in Advanced SOI CMOS Technologies," *IEEE*, 2005.
PCT Search Report and Written Opinion from PCT/US2009/001283 dated Feb. 27, 2009.
Letter from associate re PCT/US2009/001283 dated May 21, 2010.

* cited by examiner

*Primary Examiner* — Thinh T Nguyen
(74) *Attorney, Agent, or Firm* — Williams, Morgan & Amerson, P.C.

(57) ABSTRACT

By providing a CMP stop layer in a metal gate stack, the initial height thereof may be efficiently reduced after the definition of the deep drain and source areas, thereby providing enhanced process conditions for forming highly stressed dielectric materials. Consequently, the dielectric material may be positioned more closely to the channel region substantially without deteriorating gate conductivity.

18 Claims, 6 Drawing Sheets

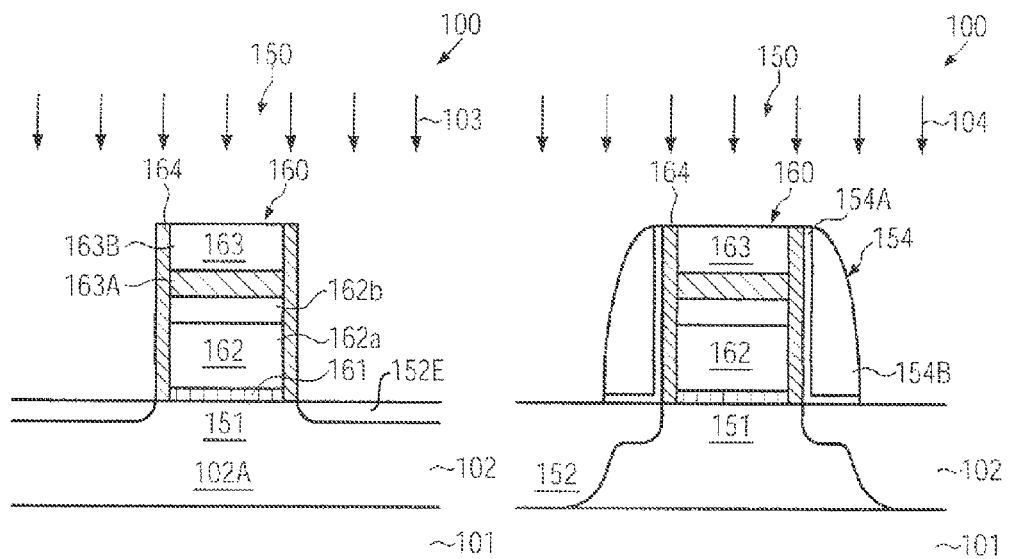
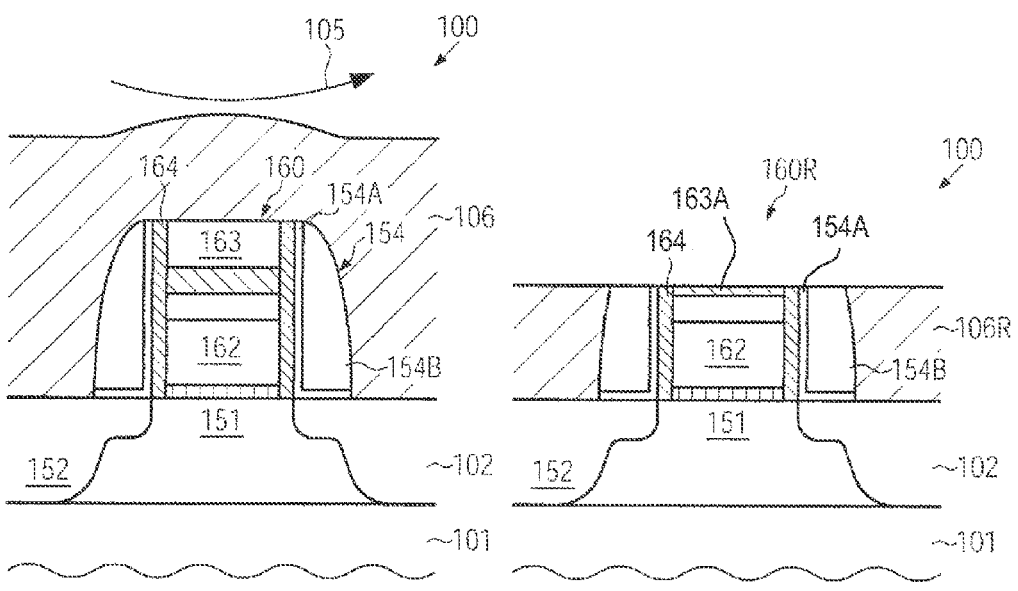

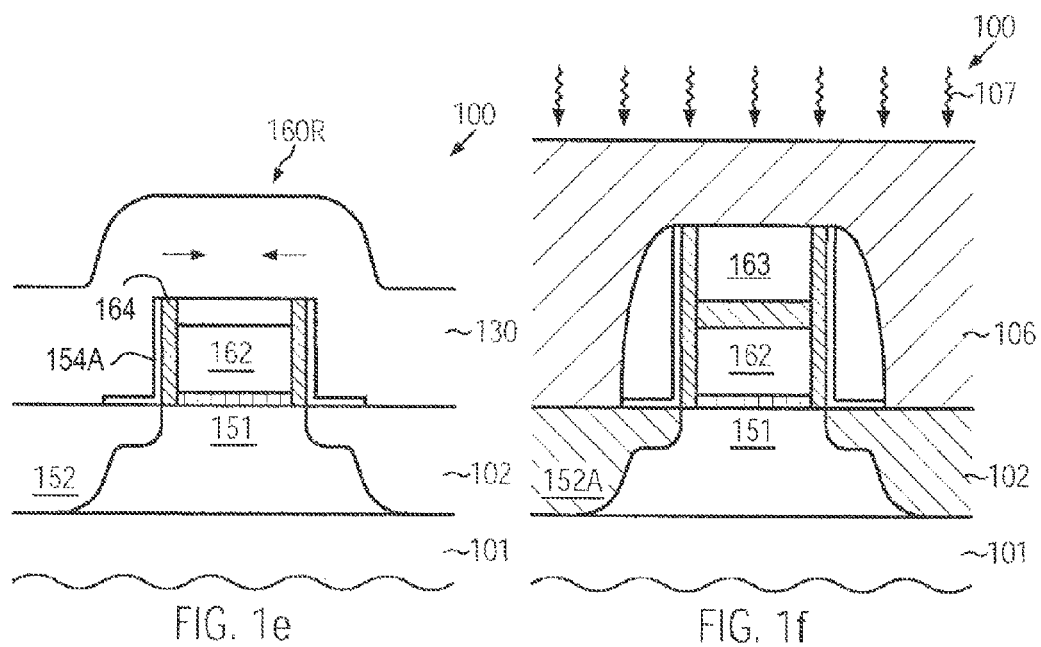
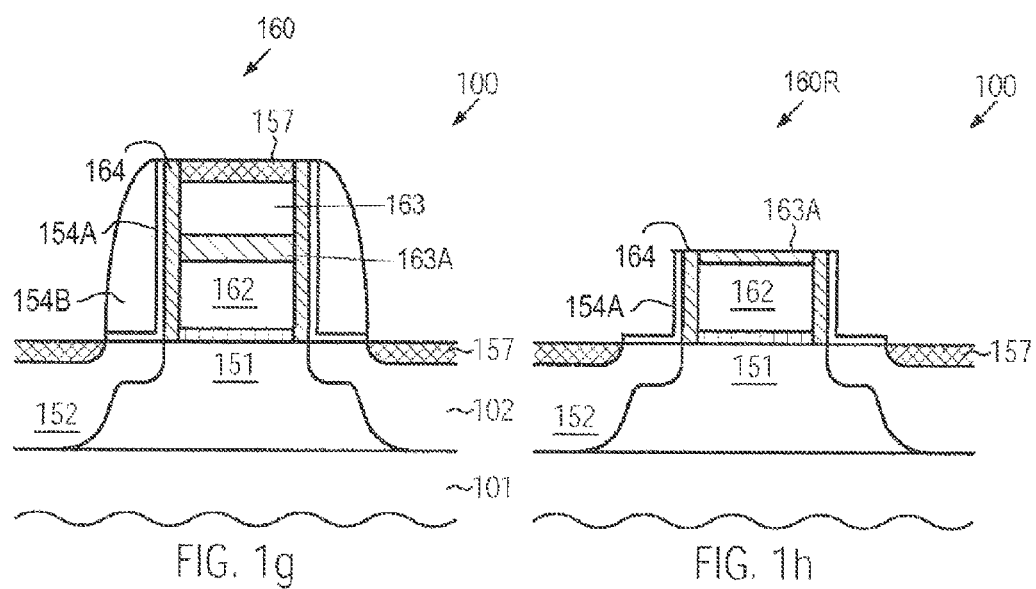

SEMICONDUCTOR DEVICE COMPRISING A METAL GATE STACK OF REDUCED HEIGHT AND METHOD OF FORMING THE SAME

BACKGROUND

1. Field of the Disclosure

Generally, the present disclosure relates to the fabrication of sophisticated integrated circuits including highly scaled transistor elements comprising gate structures of increased capacitance, including a high-k gate dielectric of increased permittivity compared to conventional gate dielectrics, such as silicon dioxide and silicon nitride.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit elements that substantially determine performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

Presently, the vast majority of integrated circuits are based on silicon, due to its substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices, has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage without sacrificing the electrical characteristics of the interface.

For the reasons pointed out above, silicon dioxide is preferably used as a gate insulation layer in field effect transistors that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, high speed transistor elements having an extremely short channel may preferably be used for high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials such as tantalum oxide ($Ta_2O_5$) with a k of approximately 25, strontium titanium oxide (Sr-$TiO_3$) having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide layer, while additionally maintaining leakage currents at an acceptable level. On the other hand, the non-polysilicon material, such as titanium nitride and the like, may be formed to connect to the high dielectric material, thereby substantially avoiding the presence of a depletion zone. Since, typically, a low threshold voltage of the transistor, which represents the voltage at which a conductive channel forms in the channel region, is desired to obtain high drive currents, commonly, the controllability of the respective channel requires pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region so as to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll off, and also reducing significant variations of transistor performance with a variation in gate length. Since the threshold voltage of the transistors is significantly determined by the work function of the metal-containing gate material, an appropriate adjustment of the effective work function with respect to the conductivity type of the transistor under consideration has to be guaranteed.

In addition to increasing the capacitive coupling of the gate electrodes to the channel region and the overall reduction of the gate resistance, further techniques have been developed in an attempt to further enhance performance of silicon-based field effect transistors. One promising approach is the modification of the lattice structure of a silicon crystal, since, by appropriately generating strain in the channel region of the transistors, the charge carrier mobility therein, i.e., the electron mobility or the hole mobility, may be increased, thereby also resulting in an increased drive current capability. For example, for a standard crystallographic configuration of the silicon material, i.e., a (100) surface orientation with the channel length direction orientated along a <110> crystal axis, tensile strain along the transistor length direction may result in increased electron mobility, while a compressive strain along the transistor length direction may result in an increase of hole mobility. Consequently, a plurality of process technologies have been developed to locally provide a desired type of strain in order to individually enhance transistor performance.

One efficient approach is frequently used and involves the positioning of highly stressed dielectric materials in the vicinity of the channel region after completion of the basic transistor structure. For instance, a portion of the interlayer dielectric material, for instance, an etch stop layer to pattern contact openings in the interlayer dielectric material, may be positioned close to the transistor structure and may therefore act as a source for mechanical stress that may be transferred into the channel region to create the desired type of strain therein. The type and the magnitude of the internal stress level of the dielectric material may be controlled by the deposition parameters wherein, for instance, silicon nitride may be efficiently deposited on the basis of plasma-enhanced deposition techniques with high internal compressive and tensile stress. Although provision of stressed dielectric materials above the individual transistor elements provides significant performance enhancement, the overall efficiency of the strain-inducing mechanism may be determined by the amount of the dielectric material positioned close to the channel region and the internal stress level thereof. It turns out, however, that the magnitude of the internal stress level and the amount of material that may be deposited may significantly depend on the deposition characteristics of the deposition technique under consideration, wherein, in particular for sophisticated device geometries, restrictive deposition-related constraints may be imposed, thereby limiting the efficiency of the strain-inducing mechanism. For example, the pronounced surface topography obtained in highly-scaled transistor elements may be determined by the reduced distance between neighboring circuit elements and the height of the gate electrode structures, which may be substantially determined by the ion-blocking effect during the definition of the drain and source regions. Consequently, although efficient process techniques may be available for enhancing transistor performance, for instance by reducing the gate resistance, increasing the capacitive-coupling, enhancing the charge carrier mobility in the channel region, it turns out that conventional process techniques may not be compatible with significantly enhancing the effect of one or more of these mechanisms, without contributing to a degradation in performance with respect to one or more of the other mechanisms.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the subject matter disclosed herein relates to semiconductor devices and methods for forming the same in which sophisticated gate electrodes may be used in combination with enhanced strain-inducing mechanisms by appropriately reducing the gate height prior to the deposition of the stressed dielectric material, without negatively affecting the process of forming the drain and source regions and also not unduly contributing to a reduced gate conductivity. For this purpose, in some illustrative aspects, a metal gate stack with a high-k dielectric material may be provided in combination with a mask material to comply with the ion-blocking characteristics required during the formation of deep drain and source regions, wherein at least a portion of the mask material may be removed at any appropriate manufacturing stage prior to the provision of stressed dielectric materials, which may therefore be provided on the basis of a less pronounced surface topography, while also positioning the stressed dielectric material more closely to the channel region.

One illustrative method disclosed herein comprises forming a gate electrode of a transistor above a semiconductor layer, wherein the gate electrode comprises a high-k dielectric layer, a metal-containing material formed on the high-k dielectric layer and a mask material formed above the metal-containing material. The method further comprises forming drain and source regions in the semiconductor layer by using the gate electrode as an implantation mask and removing at least a portion of the mask material of the gate electrode to reduce a height of the gate electrode. Additionally, the method comprises forming a strain-inducing dielectric layer above the drain and source regions and the gate electrode of reduced height, wherein the strain-inducing dielectric layer generates strain in a channel region of the transistor.

A further illustrative method disclosed herein comprises forming a first gate electrode of a first transistor above a semiconductor layer, wherein the first gate electrode comprises a high-k dielectric material and a first metal-containing material. Additionally, the method comprises forming a second gate electrode of a second transistor, wherein the second gate electrode comprises a high-k dielectric material and a second metal-containing material. Furthermore, drain and source regions of the first and second transistors are defined in the semiconductor layer by implanting dopant species and using the first and second gate electrodes as implantation masks. Furthermore, the method comprises reducing a height of the first and the second gate electrodes after defining the drain and source regions and forming a first strain-inducing layer above the first gate electrode of reduced height and a second strain-inducing layer above the second gate electrode of reduced height, wherein the first and the second strain-inducing layers generate a different type of strain.

One illustrative semiconductor device disclosed herein comprises a first transistor comprising a gate electrode, which comprises a high-k gate dielectric material and a metal-containing electrode material formed on the high-k dielectric material. The transistor further comprises drain and source regions formed in a semiconductor layer, wherein also a strain-inducing dielectric material is formed on the metal-containing electrode material.

BRIEF DESCRIPTION OF THE DRAWINGS

The disclosure may be understood by reference to the following description taken in conjunction with the accompanying drawings, in which like reference numerals identify like elements, and in which:

FIGS. 1a-1e schematically illustrate cross-sectional views of a transistor during various manufacturing stages, in which a metal gate including a high-k dielectric material may be reduced in height after the formation of drain and source regions in order to enhance the strain effect of a dielectric material, according to illustrative embodiments;

FIG. 1f schematically illustrates a cross-sectional view of a transistor during an intermediate manufacturing stage, in which a fill material may additionally be used for providing enhanced strain in the channel region, according to further illustrative embodiments;

FIGS. 1g-1h schematically illustrate the transistor during various manufacturing stages, wherein metal silicide regions are provided at different height states of the gate electrode, according to still further illustrative embodiments.

Figure 2A:
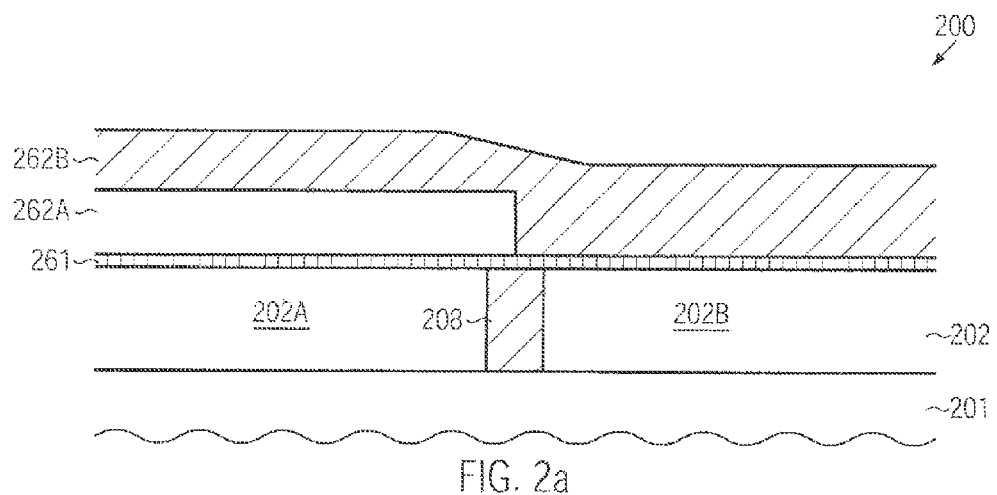
FIGS. 2a-2g schematically illustrate cross-sectional views of a semiconductor device including transistors of different conductivity type during various manufacturing stages in forming metal gates with a high-k dielectric material of reduced height in combination with stress-inducing layers, according to still further illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure relates to methods and devices in which sophisticated gate electrode structures including a high-k dielectric material and a metal-containing conductive material may be formed with a reduced height, while nevertheless providing the required ion-blocking effect during the implantation processes for defining the drain and source regions. For this purpose, in illustrative embodiments disclosed herein, initially, the metal gate stack may be formed on the basis of an appropriate mask material, such as polysilicon, which may be removed at any appropriate manufacturing stage after the drain and source implantation processes, wherein, in some illustrative embodiments, a material for controlling the removal process may be provided, for instance, in the form of a chemical mechanical planarization (CMP) stop layer or an etch stop layer, thereby providing enhanced overall process uniformity substantially without affecting integrity of the metal-containing electrode material. In some aspects, an efficient removal of the mask material may be accomplished by additionally providing a fill material, which may be reduced in height commonly with the mask material, thereby providing a desired high degree of mechanical integrity during the material removal process. In this case, the control layer may provide an appropriate determination of the end point of the removal process and may also be advantageously used in subsequent manufacturing stages, such as the removal of the remaining fill material, the formation of metal silicide regions and the like. Consequently, on the basis of the reduced gate height, which may not substantially negatively affect the overall gate resistance due to the high conductivity of the metal-containing electrode material, the resulting surface topography may enable the deposition of a highly stressed dielectric material on the basis of significantly relaxed deposition constraints, while also positioning the material more closely to the channel region of the transistor element.

Furthermore, in some illustrative aspects disclosed herein, the fill material or at least a portion thereof may be advantageously used for inducing additional strain in the channel region by appropriately annealing certain transistors, such as N-channel transistors, in the presence of the fill material, which may result in a strained re-growth of the drain and source areas, which may enable a further enhancement of transistor performance. Consequently, the reduced gate height may enhance deposition conditions and the overall efficiency of the strain-inducing mechanism, in combination with also reducing the fringing capacitance of the gate electrode, while not substantially negatively affecting the series resistance of the gate electrode. Moreover, by appropriately arranging the overall process flow, additional stress memorization techniques may be applied without adding to the process complexity.

FIG. 1a schematically illustrates a cross-sectional view of a semiconductor device 100 comprising a substrate 101 having formed thereon a semiconductor layer 102, for instance, a silicon layer, a silicon-containing layer and the like, which may be configured so as to enable the formation of transistor elements therein and thereabove. For example, as previously explained, complex integrated circuits may be manufactured on the basis of silicon due to the well-understood characteristics and the superior availability thereof. It should be understood, however, that a silicon-containing semiconductor layer is to be understood as a material, in which may be incorporated other components, such as germanium, carbon, tin, a varying degree of dopant species and other impurity materials, depending on the overall process and device requirements. In some illustrative embodiments, the semiconductor layer 102 may be formed on a buried insulating layer (not shown), thereby defining a semiconductor-or silicon-on-insulator (SOI) configuration, while, in other cases, the semiconductor layer 102 may represent an upper portion of a substantially crystalline material of the substrate 101. In still other cases, an SOI configuration and a "bulk" configuration, i.e., a configuration in which a thickness of the semiconductor layer 102 may be significantly greater than the depth of any circuit elements formed therein, may be commonly provided in different device regions of the device 100.

Furthermore, the semiconductor layer 102 may comprise an active region 102A, which is to be understood as an appropriately-doped semiconductor region for forming therein and thereon respective transistor elements having drain and source regions and a channel region. In the manufacturing stage shown in FIG. 1a, the device 100 may comprise a transistor 150 including a gate electrode structure 160, which may comprise a gate insulation layer 161 electrically isolating the gate electrode 160 from a channel region 151. The gate insulation layer 161 may comprise a high-k dielectric material, which is to be understood as a material having a relative permittivity of 10 or higher. For example, the gate insulation layer 161 may comprise one or more of the materials described above, such as hafnium-based or zirconium-based dielectric materials, thereby significantly increasing the capacitance between the gate electrode 160 and the channel region 151 for a similar layer thickness compared to conventionally used silicon dioxide gate dielectrics. For example, the gate insulation layer 161 may be provided with a thickness of approximately 15-25 Å for highly sophisticated applications.

The gate electrode 160 may further comprise a metal-containing material 162, wherein at least a portion thereof, such as a portion 162a in contact with the gate insulation layer 161, has a first work function adjusted such that the Fermi level is appropriately located with respect to the band gap of the doped silicon material in the channel region 151. Hence, if the transistor 150 represents an N-channel transistor, the first portion 162a may have a Fermi level in the vicinity of the upper band gap edge, which may, for instance, be accomplished by providing the first portion 162a in the form of an alloy of a metal, which may, for instance, be included in a second portion 162b and which may be appropriate for providing a suitable work function for a P-channel transistor. It should be appreciated, however, that, in other cases, the metal-containing material 162 may represent a substantially continuous material component, if the work function thereof provides the desired Fermi level. By appropriately selecting the work function of the material 162, or at least the portion 162a thereof, the threshold voltage of the transistor 150 may be maintained at a low level, thereby providing the potential for enhancing the channel control on the basis of, for instance, halo implantation processes, as previously explained.

The gate electrode 160 may further comprise a mask material 163, which, in some illustrative embodiments, may be provided in the form of a polysilicon material, thereby providing a high degree of compatibility with conventional manufacturing techniques for forming metal gates. In other illustrative embodiments, the mask material 163 may be provided in the form of any other appropriate material, such as dielectric materials in the form of silicon dioxide, silicon nitride, silicon oxynitride, silicon carbide, carbon material and the like, depending on the overall process strategy. In one illustrative embodiment, the mask material 163 may comprise a material layer 163A located such that a portion 163B of the mask material 163 may be separated from the actual electrode material 162, wherein the material layer 163A, which may also be referred to as a removal control layer, and may have different material characteristics compared to the portion 163B so as to enable the control of a removal process for the portion 163B in a later manufacturing stage. For example, the portion 163B may be comprised of polysilicon, while the material layer 163A may be comprised of silicon dioxide, silicon nitride and the like. Consequently, upon removing the portion 163B, for instance by chemical mechanical planarization or polishing (CMP) and/or etch processes, the layer 163A may provide desired stop capabilities or at least endpoint detection capabilities to enhance the overall uniformity during the removal of the portion 163B substantially without sacrificing the integrity of the electrode material 162. Generally, the mask material 163, for instance in the form of the portions 163B and 163A, may provide a sufficient gate height so as to substantially avoid undue doping of the channel region 151 during the formation of the drain and source regions in the active region 102A. Furthermore, in the manufacturing stage shown, the gate electrode 160 may further comprise appropriately designed offset spacers 164, which may, for instance, be provided in the form of a silicon dioxide material having an appropriate width so as to adjust an offset of drain and source extension regions 152E, which may be defined on the basis of an implantation process 103.

The semiconductor device 100 as shown in FIG. 1a may be formed according to the following processes. Initially, trench isolation structures (not shown) may be formed on the basis of well-established techniques, including lithography, etch and deposition processes. Thereafter, appropriate implantation processes may be performed to define the active region 102A, for example with respect to channel doping and the like. Next, the high-k dielectric material may be formed on the basis of appropriate deposition techniques, wherein a layer thickness may be maintained within the above-specified range for sophisticated devices. Thereafter, the metal-containing material 162 may be deposited, for instance, on the basis of chemical vapor deposition (CVD), physical vapor deposition (PVD) and the like. For example, in a first step, material of the portion 162a be deposited and may be treated in any appropriate manner to provide the desired electronic characteristics, as previously explained. Since in other device regions other characteristics may be required, additional materials may be deposited, for instance, such as the portion 162b and the like, wherein a substantially planar surface topography may also be created to enhance the further processing of the device 100. Thereafter, the mask material 163 may be deposited, wherein, in one illustrative embodiment, the material layer 163A may be provided so as to have different material characteristics compared to the portion 163B. For instance, silicon nitride, silicon dioxide, silicon oxynitride or any other appropriate materials providing sufficient CMP stop or etch stop capabilities may be deposited, followed by the deposition of the material 163B, such as polysilicon, thereby providing a high degree of compatibility with conventional process techniques. In other embodiments, any other material, such as silicon dioxide, silicon nitride and the like, may be used for the portion 163B, while the material 163A differs therefrom in material composition to provide the desired stop or control characteristics. Consequently, the resulting gate layer stack may have a height as is considered appropriate for the formation of deep drain and source areas in a later manufacturing stage.

Next, the gate layer stack may be patterned by using sophisticated lithography techniques, wherein, for instance, the mask material 163 or a portion thereof, such as the portion 163B, may be used as a hard mask material, which may be patterned on the basis of a resist mask by, for instance, well-established silicon etch techniques in order to pattern the portion 163B, when comprised of polysilicon, wherein the material layer 163A may act as an efficient etch stop layer. Thereafter, the etch chemistry may be appropriately selected so as to etch the layer 163A and the metal-containing material 162. Finally, the high-k dielectric material may be patterned in order to obtain the gate insulation layer 161. Thereafter, the offset spacer elements 164 may be formed by deposition and anisotropic etch techniques, followed by the implantation process 103. It should be appreciated that additional implantation processes may be performed, for instance, for defining a halo region, as previously explained.

FIG. 1b schematically illustrates the semiconductor device 100 in a further advanced manufacturing stage. As illustrated, the transistor may comprise a spacer structure 154 formed on the offset spacer 164, wherein one or more individual spacer elements, such as spacers 154B may be provided, in combination with an appropriate etch stop material 154A. The spacer structure 154 may define the lateral profiling of drain and source regions 152 by acting as an implantation mask, together with the remaining gate electrode 160, wherein a height thereof may be sufficient so as to substantially avoid undue incorporation of dopant species in the channel region 151. It should be appreciated that the spacer structure 154 may have any other appropriate configuration at various manufacturing stages so as to enable intermediate implantation processes, such as the process 104, in order to finally obtain the desired lateral and vertical profile of the drain and source regions 152.

FIG. 1c schematically illustrates the semiconductor device 100 during a removal process 105, which may be designed to reduce the height of the gate electrode 160. In the embodiment shown, a fill material 106 may be provided to at least laterally enclose the gate electrode 160 in order to enhance the mechanical integrity of the gate electrode 160 during the removal process 105. In some illustrative embodiments, any appropriate material may be provided, thereby enabling a controlled removal of at least a portion of the mask material 163. For example, silicon dioxide, silicon nitride and the like may be efficiently removed on the basis of CMP techniques using well-established recipes, wherein, after a planarization phase, a portion of the gate electrode 160 may also be removed with a high degree of process uniformity. In other illustrative embodiments, the removal process 105 may also comprise an etch process, for instance for planarizing the surface topography and removing at least a portion of the fill material 106 above the gate electrode 160.

The fill material 106 may be formed on the basis of any appropriate deposition technique, such as CVD, spin-on techniques and the like. For instance, if the mechanical characteristics of a polymer material may be considered appropriate for the removal process 105, efficient spin-on methods may be used to obtain a less pronounced surface topography after the provision of the fill material 106, which may then be planarized in a highly efficient manner by CMP, thereby also removing a portion of the mask material 163. As previously explained, in some illustrative embodiments, the material layer 163A may provide appropriate stop or control characteristics during the removal process 105, for instance by appropriately slowing down the removal rate upon exposure of the layer 163A, which may provide a high degree of across-substrate uniformity. For instance, selective CMP recipes may be available for silicon, silicon nitride, with respect to silicon dioxide, or silicon with respect to silicon dioxide, and the like.

FIG. 1d schematically illustrates the semiconductor device 100 after the removal process 105, during which at least a portion of the mask material 163 may have been removed. Consequently, the gate electrode 160 may now have a significantly reduced height and may now be indicated as gate electrode 160R. Similarly, in the manufacturing stage shown, the remaining portion of the fill material 106, indicated by 106R, may laterally enclose the gate electrode 160R. Furthermore, in the embodiment shown in FIG. 1d, the stop or control material layer 163A may still be present, however, with a reduced thickness, dependent on the overall process characteristics of the removal process 105 and the stop or control capabilities of the layer 163A. For example, the layer 163A may be provided with a sufficient thickness so that after exposure thereof a required over etch or polishing time may not result in an exposure of the underlying metal-containing material 162 due to the reduced removal rate of the layer 163A. Consequently, during the process 105, the further processing integrity of the material 162 may be preserved. Thus, in some illustrative embodiments, the remaining material 106R may be removed on the basis of an appropriate selective etch process, wherein the layer 163A may provide the desired integrity of the underlying metal-containing material 162.

Thereafter, the layer 163A may be removed, for instance by an appropriately selected chemical etch recipe, without unduly affecting the underlying material. In still other illustrative embodiments, after the removal of the material 106R, metal silicide may be formed, as will be discussed later on in more detail with reference to FIGS. 1g-1h wherein the material layer 163A may also provide enhanced process efficiency due to maintaining integrity of the gate electrode material 162. In some illustrative embodiments, the remaining material 106R may be removed selectively to the residue of the spacer structure 154, when the fill material 106 may have different etch characteristics compared to the spacer structure 154. In a further illustrative embodiment, the spacer element 154B may be comprised of substantially the same material as the fill material 106 or may have at least similar etch characteristics, thereby enabling the concurrent removal of the residual material 106R and spacer element 154B.

FIG. 1e schematically illustrates the semiconductor device 100 in a further advanced manufacturing stage. As shown, a strain-inducing layer 130 may be formed above the transistor 150 and thus also above the reduced gate electrode 160R, wherein an internal stress level of the layer 130 is selected such that a desired type of strain is obtained in the channel region 151. As previously discussed, during the deposition of the layer 130, a significantly reduced surface topography may enable less restrictive deposition conditions, thereby possibly enabling the provision of the layer 130 with an increased thickness and hence also increasing the amount of strain obtained in the channel region 151. Furthermore, due to the reduced gate height, the stressed material of the layer 130 positioned above the gate electrode 160R may be located closer to the channel region 151, compared to conventional semiconductor devices in which a significant amount of polysilicon material may still be present. In the illustrative embodiment shown in FIG. 1e, the spacer element 154B may have been removed, for instance during a common etch process for removing the residual material 106R, as previously discussed, thereby also positioning the highly stressed material of the layer 130 with a reduced lateral distance with respect to the channel region 151. Moreover, as illustrated, the material layer 163A may have been removed prior to the deposition of the layer 130, when an even further enhanced strain transfer mechanism through the gate electrode 160R may be desired. In other cases, the layer 163A may be maintained and may be used as an etch stop material for maintaining integrity during the process sequence for forming the strain-inducing layer 130.

Thereafter, the further processing may be continued by depositing a further interlayer dielectric material and patterning the same to establish contact to respective transistor areas, as will also be described later on with reference to FIGS. 2a-2f.

FIG. 1f schematically illustrates the semiconductor device 100 according to still further illustrative embodiments. As previously explained, an efficient strain-inducing mechanism may be accomplished, for instance, for N-channel transistors, by re-crystallizing substantially amorphized areas in the drain and source regions 152 in the presence of a rigid material layer, which may therefore result in a strained state of the re-crystallized material in the drain and source regions 152. For this purpose, an appropriately designed amorphization implantation process may be performed at any appropriate stage prior to providing the fill material 106 and any additional heat treatments may be avoided in order to maintain the drain and source regions 152 in a substantially amorphized state, as indicated by 152A. Thus, the fill material 106 may be provided with appropriate material characteristics in order to avoid reduction in volume of the portion 152A upon re-crystallization in order to obtain a desired strain state. For example, the fill material 106 may be provided in the form of a silicon nitride material.

During an anneal process 107, a strained state of the drain and source regions 152 may be accomplished, which may also result in a respective strain in the channel region 151, even if the fill material 106 may be removed at a later manufacturing stage, as described above. It should be appreciated that, in other illustrative embodiments, the anneal process 107 may be performed at a later manufacturing stage, for instance, as shown in FIG. 1d, so that the residual material 106R may act as the rigid material in order to obtain the desired strained state of the drain and source regions 152. Consequently, the overall strain in the channel region 151 obtained by the layer 130 may further be increased by appropriately positioning the anneal process 107 within the overall process flow, possibly in combination with a respective amorphization implantation, such that the fill material 106 may also act as a rigid material, thereby avoiding any additional process complexity, if a stress memorization technique is to be applied for the transistor 150.

With reference to FIGS. 1g-1h, further illustrative embodiments will be described, in which a silicidation process may be performed at various manufacturing stages, depending on the overall process strategy.

FIG. 1g schematically illustrates the device 100, prior to the deposition of the fill material 106, wherein, additionally, metal silicide regions 157 may be formed in the drain and source regions, if required, while a metal silicide region 157 may also be provided in the mask material 163 of the gate electrode 160, when the mask material comprises a polysilicon material. Thus, if a metal silicide is to be formed in the drain and source regions 152, a high degree of compatibility with conventional process techniques may be achieved, wherein, additionally, the material layer 163A may provide the integrity of the metal-containing material 162, if any further processes performed during the formation of the metal silicide regions 157 and a later manufacturing stage may result in an additional metal diffusion. Consequently, although well-established process strategies may be applied, nevertheless, enhanced integrity of the metal in the gate electrode 160 may be achieved.

FIG. 1h schematically illustrates the device 100 according to still further illustrative embodiments, in which, starting from a manufacturing stage as shown in FIG. 1d, the residual material 106R may have been removed, for instance, together with the outer spacer element 154B, while the material layer 163A may still be present at the top of the reduced gate electrode 160R. Thus, during the subsequent silicidation process, the integrity of the material 162 may be maintained, while the metal silicide regions 157 may be formed in a self-aligned manner in the drain and source region 152. Thereafter, the layer 163A may or may not be removed, depending on the process strategy.

With reference to FIGS. 2a-2g, further illustrative embodiments will now be described, in which a metal gate of reduced height may be provided for transistors of different conductivity type, while strain-inducing layers of different internal stress may also be formed, wherein an initial gate height may be appropriately selected so as to substantially avoid undue channel doping.

FIG. 2a schematically illustrates a semiconductor device 200 comprising a substrate 201, above which may be formed a semiconductor layer 202. Further, an isolation structure 208 may be provided in the layer 202, thereby defining a first active region 202A and a second active region 202B. Furthermore, a gate dielectric 261 comprising a high-k dielectric material may be formed on the active regions 202A, 202B, followed by one or more metal-containing electrode materials, such as an electrode material 262A formed above the first active region 202A, while a second electrode material 262B may be formed on the material 262A and above the second active region 202B. With respect to the components described so far, the same criteria may apply as previously explained with reference to the device 100. In the illustrative embodiment shown, the active regions 202A, 202B may be designed for receiving transistor elements of different conductivity type. Thus, as previously explained, the electrode material 262A may be provided so as to have an appropriate work function for the active region 202A, for instance representing an N-channel transistor, while the material 262B may have an appropriate work function for the region 202B, which may represent a P-channel transistor. It should be appreciated, however, that the arrangement of the electrode materials 262A, 262B is of illustrative nature only and any other configuration may be selected, for instance by selectively providing the materials 262A, 262B above the respective active regions and/or by providing a common "planarization" electrode material layer above the materials 262A, 262B, to obtain a superior surface topography, and the like. For example, in the embodiment shown, the material 262B may also act as a planarization material, which may be planarized in a subsequent process step, for instance by CMP, so as to obtain a substantially planar surface topography, wherein the materials 262A, 262B may be present above the region 202A, while only the material 262B may be provided above the region 202B.

Figure 2B:
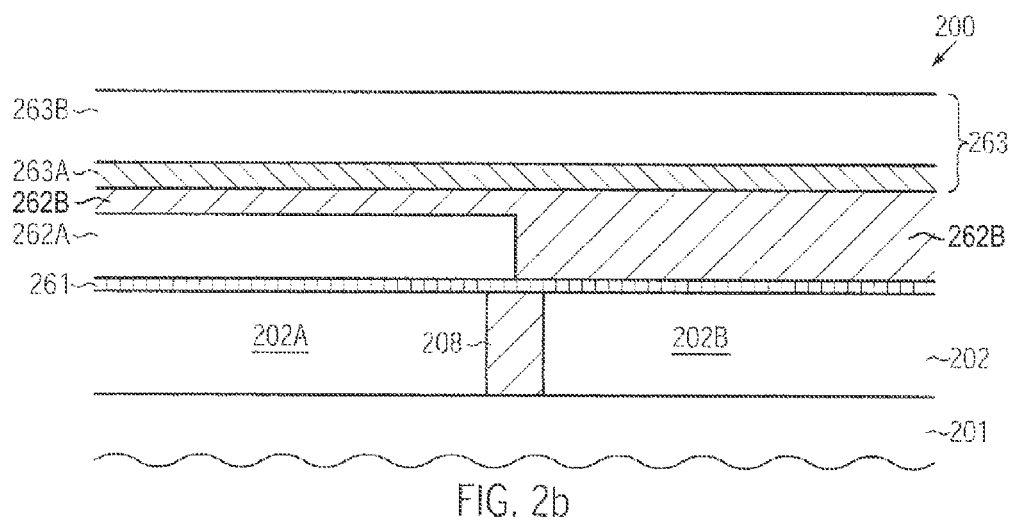

FIG. 2b schematically illustrates the device 200 in a further advanced manufacturing stage, in which a stop or control material layer 263A may be provided as a part of a mask material 263, which may additionally include at least one further portion 263B having a different material composition compared to the material layer 263A. For example, any appropriate material may be used for the portions 263A, 263B, as long as respective control or stop capability may be obtained with respect to a process for removing a portion of the material 263 in a later manufacturing stage. The material 263 may be formed on the basis of process techniques, as previously described with reference to the material 163.

Figure 2C:
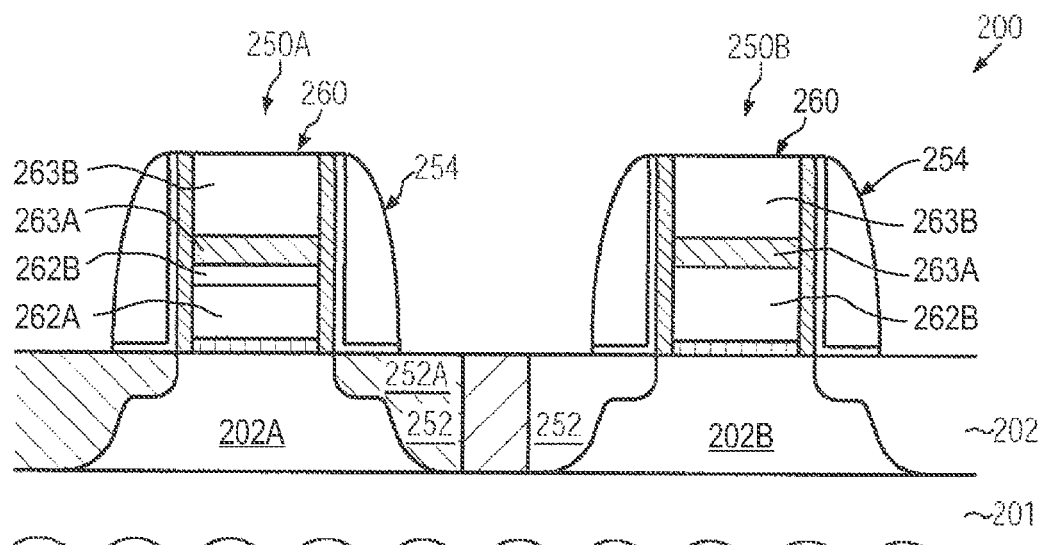

FIG. 2c schematically illustrates the semiconductor device 200 in a further advanced manufacturing stage. As shown, a first transistor 250A, for instance, an N-channel transistor, and a second transistor 250B, such as a P-channel transistor, may be provided so as to include gate electrodes 260, which may have a similar configuration as previously explained with reference to the gate electrode 160. Furthermore, a spacer structure 254 may be formed on sidewalls of the gate electrodes 260 and drain and source regions 252 may be formed in the respective active regions 202A, 202B.

The semiconductor device 200 comprising the transistors 250A, 250B may be formed on the basis of similar process techniques as previously described. That is, the gate electrodes 260 may be patterned in accordance with techniques as previously discussed, followed by the formation of the spacer structure 254 with intermediate implantation processes in order to define the drain and source regions 252. In one illustrative embodiment, as shown, the transistor 250B, representing a P-channel transistor, may be in a state in which the drain and source regions 252 may be in a substantially crystalline state. For this purpose, the drain and source regions 252 of the transistor 250B may have been formed prior to forming deep drain and source regions for the transistor 250A with a subsequent anneal process so as to re-crystallize implantation induced damage. On the other hand, an amorphization implantation may have been performed for the transistor 250A, thereby obtaining substantially amorphized portions 252A in the drain and source areas 252 prior to or after the incorporation of the actual dopant species. Consequently, during the further manufacturing process, the substantially amorphized portions 252A may be re-crystallized in a strained state by using a fill material, which may also be used for reducing a height of the gate electrodes 260.

For this purpose, an appropriate fill material, such as silicon nitride, may be deposited so as to enclose the transistors 250A, 250B and an anneal process may be performed in order to re-crystallize the portions 252A, while substantially not unduly affecting the dopant profile in the transistor 250B. Since the drain and source regions 252 of the transistor 250B may already be in a substantially crystalline state, a significant strain generation may be avoided in this case. On the other hand, significant strain may be generated in the transistor 250A, as previously explained. Appropriate anneal techniques may include laser-based or flash-based anneal processes, in which the effective anneal times are moderately short, thereby maintaining dopant diffusion at a low level.

In other illustrative embodiments, after depositing the fill material, a removal process may be performed, as previously explained, for concurrently removing a portion of the fill material and also reducing the gate height while using the material layer 263A as an efficient stop material.

Figure 2D:
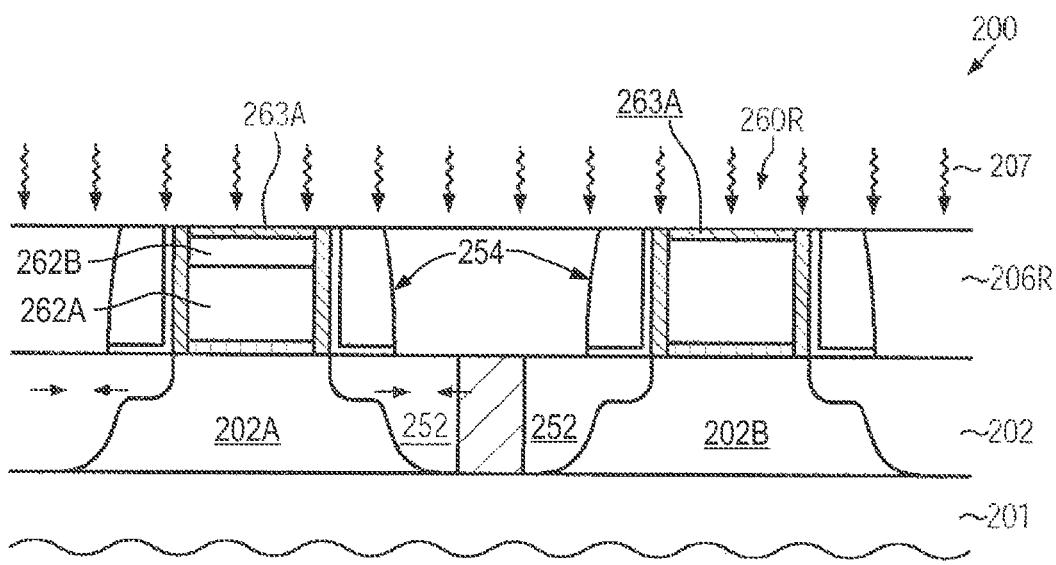

FIG. 2d schematically illustrates the semiconductor device 200 after the above-described process sequence. Hence, a fill material 206R may be provided laterally adjacent to the gate electrode structures 260, which may now have a reduced height, as indicated by 260R. Moreover, an anneal process 207 may be performed to re-crystallize the substantially amorphized portions 252A in order to obtain the desired strained state of the drain and source regions 252 in the transistor 250A.

In other illustrative embodiments, the anneal process 207 may be performed at any appropriate manufacturing state prior to the formation of the fill material 206R after the removal thereof, if an additional strain in the transistor 250A may not be desired. Thereafter, the further processing may be continued, as is also described with reference to device 100. For example, the fill material 206R may be removed, for instance in combination with the removal of portion of the spacer structure 254, as previously explained.

Figure 2E:
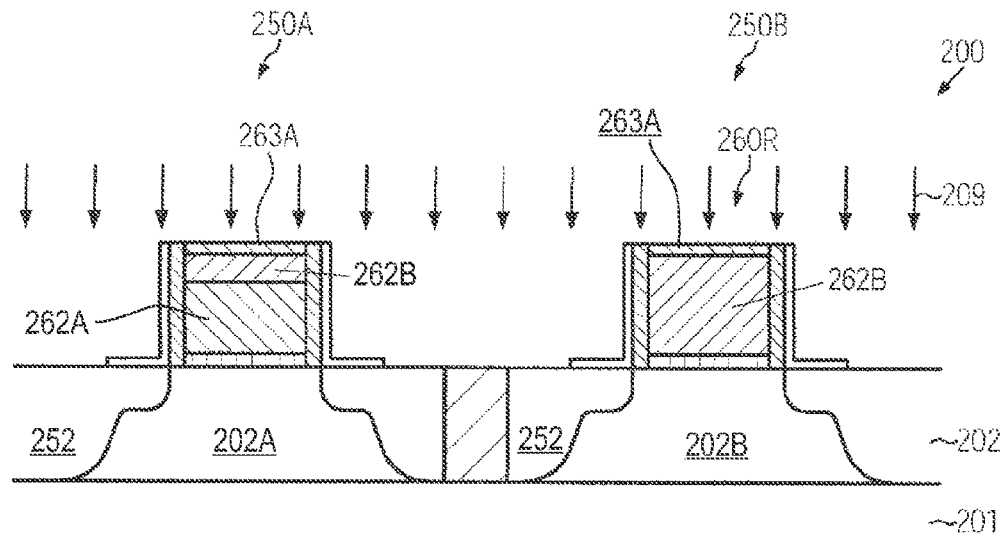

FIG. 2e schematically illustrates the device 200 after the above-described process sequence, wherein the material layer 263A, or at least a portion thereof, may provide the integrity of the underlying metal-containing materials 262A, 262B. Moreover, the device 200 may be subjected to a process sequence 209 for forming the silicide regions, if required, and for providing highly stressed dielectric material for each of the transistors 250A, 250B so as to individually enhance performance thereof.

Figure 2F:
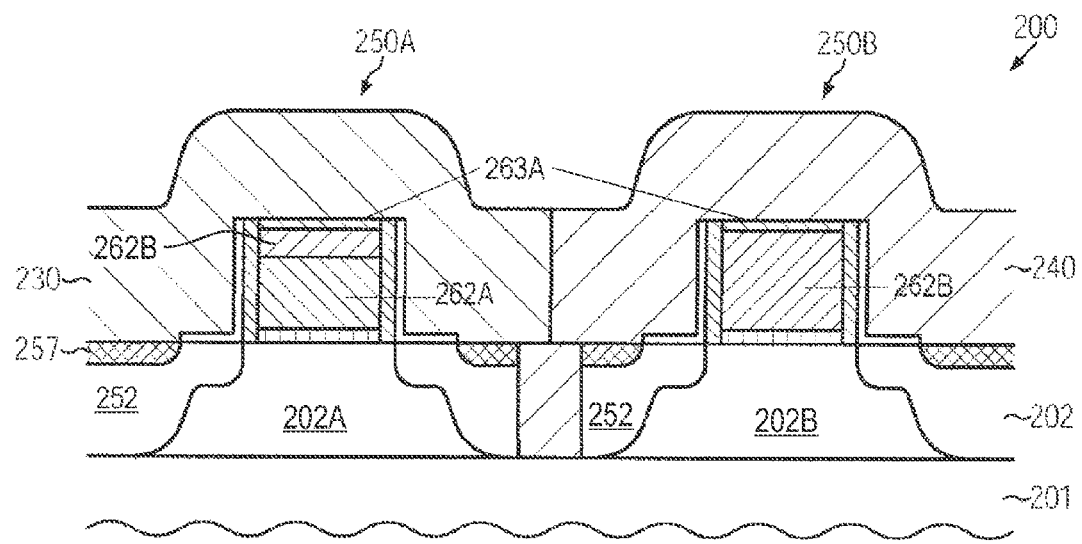

FIG. 2f schematically illustrates the device 200 in a further advanced manufacturing stage, in which metal silicide regions 257 may be formed in the drain and source regions 252, while the layer 263A may substantially avoid a silicide generation and interaction of material components with metal-containing materials 262A, 262B. Furthermore, a strain-inducing layer 230 may be formed above the transistor 250A, thereby providing a desired type of strain, wherein the reduced height of the gate electrodes may provide enhanced deposition conditions as well as a superior strain-inducing mechanism. Similarly, a strain-inducing layer 240 may be formed above the transistor 250B so as to create a different type of strain in order to enhance performance of the transistor 250B. For example, well-established patterning regimes may be used for positioning the layers 230, 240 above the respective transistors 250A, 250B, which involve the deposition of one of the layers 230, 240 and a respective removal of an unwanted portion thereof by means of lithography and etch techniques. Thus, during the removal of an unwanted portion of the stress-inducing materials, the layer 263A may provide enhanced integrity of the underlying electrode material. Thereafter, the upper one of the layers 230, 240 may be deposited and an unwanted portion thereof may be removed by lithography and etch process techniques. It should be appreciated that suitable etch stop or etch control materials may additionally be provided to enhance the overall process sequence for forming the layers 230, 240.

Figure 2G:
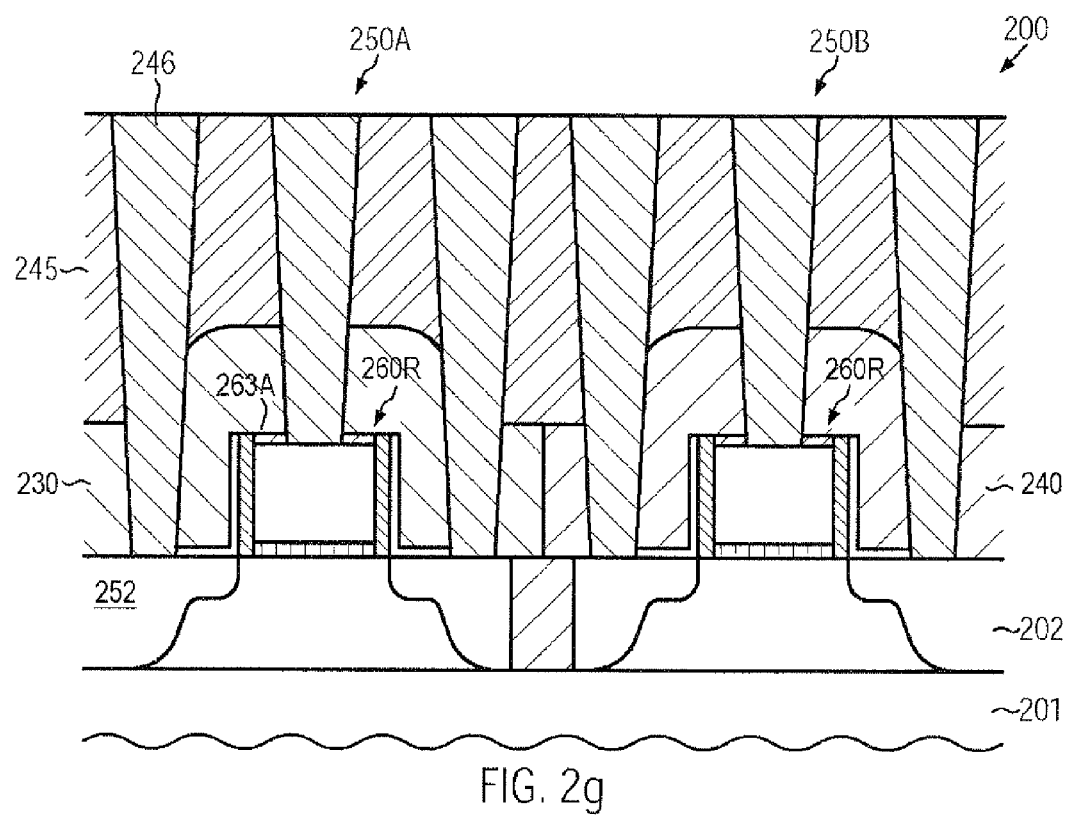

FIG. 2g schematically illustrates the semiconductor device 200 in a further advanced manufacturing stage, in which an interlayer dielectric material 245 is provided above the strain-inducing layers 230, 240, for instance in the form of silicon dioxide and the like. Furthermore, contact elements 246 may be provided so as to extend through the material 245 and the layers 230, 240 in order to connect to contact areas, such as the drain and source regions 252, or the gate electrodes 260R of the transistors 250A, 250B. The contact elements 246 may comprise any appropriate conductive material, such as tungsten, copper, aluminum, nickel and the like, possibly in combination with appropriate barrier materials.

The semiconductor device 200 as shown in FIG. 2g may be formed on the basis of well-established process techniques, wherein, additionally, the reduced height of the gate electrodes 260 may provide enhanced process uniformity, since the various height levels for forming contact openings may not be as pronounced as in conventional strategies, in which a significantly greater gate height may be used. Thus, after the deposition of the material 245, well-established lithography techniques may be used for patterning the material 245, wherein the layers 230, 240 may be used as etch stop materials. Thereafter, these layers may be opened by an appropriate process, wherein the layer 263 may also be opened in a final phase of the etch process.

As a result, the present disclosure provides techniques for enhancing transistor performance by providing sophisticated metal gate structures in combination with strain-inducing dielectric layers, wherein a gate height may be efficiently reduced after defining the deep drain and source regions in order to enhance strain-inducing mechanisms without contributing to increased channel doping. For this purpose, the initial gate stack may, in some illustrative embodiments, comprise a stop layer or control layer in order to provide enhanced process uniformity during a removal process for reducing gate height in a later manufacturing stage. In some illustrative aspects, a fill material may be used, which may also act as an efficient cap layer during a re-crystallization process for further enhancing the strain, for instance, N-channel transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a gate electrode structure of a transistor above a semiconductor layer, said gate electrode structure comprising a high-k dielectric layer, a metal-containing material formed on said high-k dielectric layer and a mask material formed above said metal-containing material;
   forming drain and source regions in said semiconductor layer by using said gate electrode structure as an implantation mask;
   removing at least a portion of said mask material of said gate electrode structure to reduce a height of said gate electrode structure; and
   forming a strain-inducing dielectric layer above said drain and source regions and said gate electrode structure of reduced height, said strain-inducing dielectric layer generating strain in a channel region of said transistor.

2. The method of claim 1, wherein forming said gate electrode structure comprises forming a first layer of said mask material having a first material composition and forming a second layer above said first layer, wherein said second layer has a second material composition that differs from said first material composition.

3. The method of claim 2, wherein removing at least a portion of said mask material comprises removing said second layer by a removal process and using said first layer for controlling said removal process.

4. The method of claim 3, wherein said removal process comprises a chemical mechanical planarization process.

5. The method of claim 1, wherein removing said at least a portion of said mask material comprises forming a fill material so as to embed said gate electrode structure in said fill material and removing said at least a portion of said mask material together with a portion of said fill material.

6. The method of claim 5, further comprising annealing said transistor in the presence of a remaining portion of said fill material.

7. The method of claim 6, wherein said fill material comprises silicon nitride.

8. The method of claim 1, further comprising forming a metal silicide at least in said drain and source regions.

9. The method of claim 8, wherein said metal silicide is formed prior to removing said at least a portion of said mask material.

10. The method of claim 8, wherein said mask material comprises a first layer and a second layer and wherein said metal silicide is formed after removing said second layer of the mask material while maintaining said first layer of the mask material when forming said metal silicide.

11. A method, comprising:
   forming a first gate electrode structure of a first transistor above a semiconductor layer, said first gate electrode structure comprising a high-k dielectric material a first metal-containing material, and a mask material;
   forming a second gate electrode structure of a second transistor, said second gate electrode structure comprising a high-k dielectric material a second metal-containing material, and said mask material;
   defining drain and source regions of said first and second transistors in said semiconductor layer by implanting dopant species and using said first and second gate electrode structures as implantation masks;
   reducing a height of said first and second gate electrode structures after defining said drain and source regions; and forming a first strain-inducing layer above said first gate electrode structure of reduced height and a second strain-inducing layer above said second gate electrode structure of reduced height, the first and second strain-inducing layers generating a different type of strain.

12. The method of claim 11, wherein forming said first and second gate electrode structures comprises forming a removal control layer above said first and second metal-containing materials and forming said mask material on said removal control layer.

13. The method of claim 12, wherein reducing a height of said first and second gate electrode structures comprises performing a removal process to remove said mask material and using said removal control layer for controlling said removal process.

14. The method of claim 13, wherein said removal process comprises a chemical mechanical planarization process.

15. The method of claim 13, wherein said removal process comprises an etch process.

16. The method of claim 13, further comprising forming a fill material at least between said first and second gate electrode structures and removing a portion of said fill material during said removal process.

17. The method of claim 12, wherein forming said first and second strain-inducing layers comprises forming said first strain-inducing layer above said first and second gate electrode structures and removing said first strain-inducing layer from above said second gate electrode structure using said removal control layer as an etch stop.

18. The method of claim 16, further comprising annealing the drain and source regions of said second transistor prior to forming the drain and source regions of said first transistor and annealing the drain and source regions of said first transistor in the presence of at least a portion of said fill material.

* * * * *